(12) United States Patent
Zaccardi

(10) Patent No.: US 7,718,471 B1
(45) Date of Patent: May 18, 2010

(54) METHOD AND APPARATUS FOR STACKED DIE PACKAGE WITH INSULATED WIRE BONDS

(75) Inventor: James Zaccardi, Chandler, AZ (US)

(73) Assignee: White Electronic Designs Corporation, Phoenix, AZ (US)

( * ) Notice: Subject to any disclaimer, the term of this patent is extended or adjusted under 35 U.S.C. 154(b) by 0 days.

(21) Appl. No.: 12/269,798

(22) Filed: Nov. 12, 2008

(51) Int. Cl.
*H01L 23/48* (2006.01)
(52) U.S. Cl. .......................... 438/109; 438/617
(58) Field of Classification Search ............ 257/77, 257/E23.024, E21.505, 686; 438/109, 617
See application file for complete search history.

(56) References Cited

U.S. PATENT DOCUMENTS

| | | | |
|---|---|---|---|
| 6,531,784 B1 * | 3/2003 | Shim et al. .................. | 257/777 |
| 6,744,141 B2 * | 6/2004 | Kimura ....................... | 257/777 |
| 6,977,439 B2 * | 12/2005 | Kang et al. .................. | 257/777 |
| 7,015,587 B1 | 3/2006 | Poddar | |
| 7,298,032 B2 * | 11/2007 | Kim et al. ................... | 257/686 |
| 7,378,298 B2 | 5/2008 | Lo | |

OTHER PUBLICATIONS

Lyn, Robert and Crockett, William, Microbonds, Inc. "Advanced Packaging and Wire Bonding Techniques Using X-Wire Insulated Bonding Wire Technology", 41 pages, 2007 Die Products Consortium, KGD Packaging & Test Workshop, Napa, California, Sep. 9-12, 2007.

* cited by examiner

*Primary Examiner*—Roy K Potter
(74) *Attorney, Agent, or Firm*—Robert D. Atkins

(57) ABSTRACT

A semiconductor package has a substrate with a plurality of contact pads. A first semiconductor die is mounted to the substrate. First wire bonds are formed between each of the center-row contact pads of the first semiconductor die and the substrate contact pads. The first wire bonds include an electrically insulative coating formed over the shaft that covers a portion of a surface of a bumped end of the first wire bonds. An epoxy material is deposited over the first semiconductor die. A second semiconductor die is mounted to the epoxy material. Second wire bonds are formed between each of the center-row contact pads of the second semiconductor die and the substrate contact pads. The second wire bonds include an electrically insulative coating formed over the shaft of the second wire bonds that covers a portion of a surface of a bumped end of the second wire bonds.

19 Claims, 3 Drawing Sheets

METHOD AND APPARATUS FOR STACKED DIE PACKAGE WITH INSULATED WIRE BONDS

FIELD OF THE INVENTION

The present invention relates in general to semiconductor devices and, more particularly, to a semiconductor package with stacked semiconductor die each having an insulated wire bond formed between contact pads of the semiconductor dies and a substrate.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

When combining several semiconductor die into a single package, it is important to minimize the overall size of the package to maintain a small package footprint. In addition to a small package footprint, however, it is important that the electrical interconnects formed between each component of the package be robust. For example, in conventional packages using wire bond electrical interconnects, the package must be sufficiently large and with sufficient space between each component to ensure the wire bonds do not contact other components of the package or each other, and that they are not bent at extreme angles. In conventional packages, if the wire bonds contact other components of the package, they may become damaged resulting in a short-circuit or other electrical malfunction.

SUMMARY OF THE INVENTION

In one embodiment, the present invention is a method of making a semiconductor package comprising providing a substrate having a plurality of contact pads formed over a first surface of the substrate, and mounting a first semiconductor die to the substrate. The first semiconductor die has center-row contact pads. The method includes forming first wire bonds between each of the center-row contact pads of the first semiconductor die and the plurality of contact pads formed over the first surface of the substrate. The first wire bonds include an electrically insulative coating formed over the shaft of the first wire bonds. The electrically insulative coating covers a portion of a surface of a bumped end of the first wire bonds. The method includes depositing an epoxy material over the first semiconductor die and around a portion of the first wire bonds, and mounting a second semiconductor die to the epoxy material. The second semiconductor die has center-row contact pads. The method includes forming second wire bonds between each of the center-row contact pads of the second semiconductor die and the plurality of contact pads formed over the first surface of the substrate. The second wire bonds include an electrically insulative coating formed over the shaft of the second wire bonds. The electrically insulative coating covers a portion of a surface of a bumped end of the second wire bonds. The method includes forming an interconnect structure on a second surface of the substrate opposite the first surface.

In another embodiment, the present invention is a method of making a semiconductor package comprising providing a substrate having a plurality of contact pads formed over a first surface of the substrate, and mounting a first semiconductor die to the substrate. The first semiconductor die has center-row contact pads. The method includes forming first wire bonds between each of the center-row contact pads of the first semiconductor die and the plurality of contact pads formed over the first surface of the substrate. The first wire bonds include an electrically insulative coating formed over the shaft of the first wire bonds. The electrically insulative coating covers a portion of a surface of a bumped end of the first wire bonds. The method includes depositing an insulating material over the first semiconductor die and around a portion of the first wire bonds, and mounting a second semiconductor die to the epoxy material. The second semiconductor die has contact pads. The method includes forming second wire bonds between each of the contact pads of the second semiconductor die and the plurality of contact pads formed over the first surface of the substrate.

In another embodiment, the present invention is a method of making a semiconductor package comprising providing a substrate having a plurality of contact pads formed over a first surface of the substrate, and mounting a first semiconductor die to the substrate. The first semiconductor die has center-row contact pads. The method includes forming first wire bonds between each of the center-row contact pads of the first semiconductor die and the plurality of contact pads formed over the first surface of the substrate. The first wire bonds include an electrically insulative coating formed over the shaft of the first wire bonds. The method includes depositing an insulating material over the first semiconductor die and around a portion of the first wire bonds, and mounting a second semiconductor die to the epoxy material. The second semiconductor die has contact pads.

In another embodiment, the present invention is a semiconductor device comprising a substrate having a plurality of contact pads formed over a first surface of the substrate, and a first semiconductor die mounted to the substrate. The first semiconductor die has center-row contact pads. The semiconductor device includes first wire bonds formed between each of the center-row contact pads of the first semiconductor die and the plurality of contact pads formed over the first surface of the substrate. The first wire bonds include an electrically insulative coating formed over the shaft of the first wire bonds. The electrically insulative coating covers a portion of a surface of a bumped end of the first wire bonds. The semiconductor device includes an insulating material deposited over the first semiconductor die and around a portion of the first wire bonds, and a second semiconductor die mounted to the epoxy material. The second semiconductor die has contact pads. The semiconductor device includes second wire bonds formed between each of the contact pads of the second semiconductor die and the plurality of contact pads formed over the first surface of the substrate.

DETAILED DESCRIPTION OF THE DRAWINGS

Figure 1A:
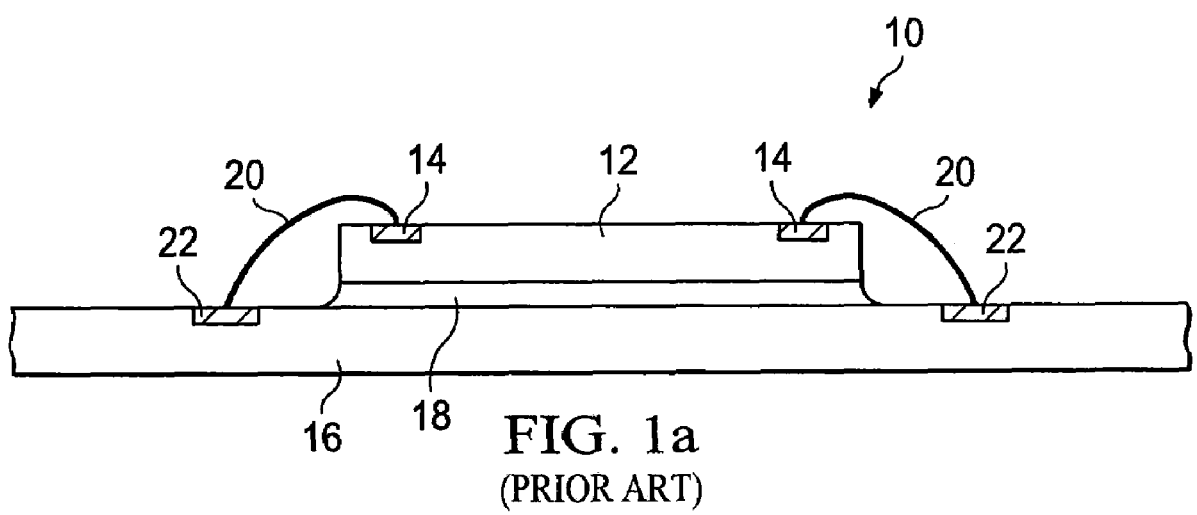
FIG. 1a illustrates a side, cross-sectional view of a conventional semiconductor die mounted to a substrate, a plurality of wire bonds form electrical connections between contact pads of the semiconductor die and contact pads of the substrate.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Back-end manufacturing refers to cutting or singulating the finished wafer into the individual die and then packaging the die for structural support and environmental isolation. To singulate the die, the wafer is scored and broken along nonfunctional regions of the wafer called saw streets or scribes. The wafer is singulated using a laser cutting device or saw blade. After singulation, the individual die may be mounted to a package substrate that includes pins or contact pads for interconnection with other system components. Contact pads formed over the semiconductor die are then connected to contact pads within the package. The electrical connections can be made with solder bumps, stud bumps, conductive paste, or wire bonds. An encapsulant or other molding material is deposited over the package to provide physical support and electrical isolation. The finished package is then inserted into an electrical system and the functionality of the semiconductor device is made available to the other system components.

Figure 1B:
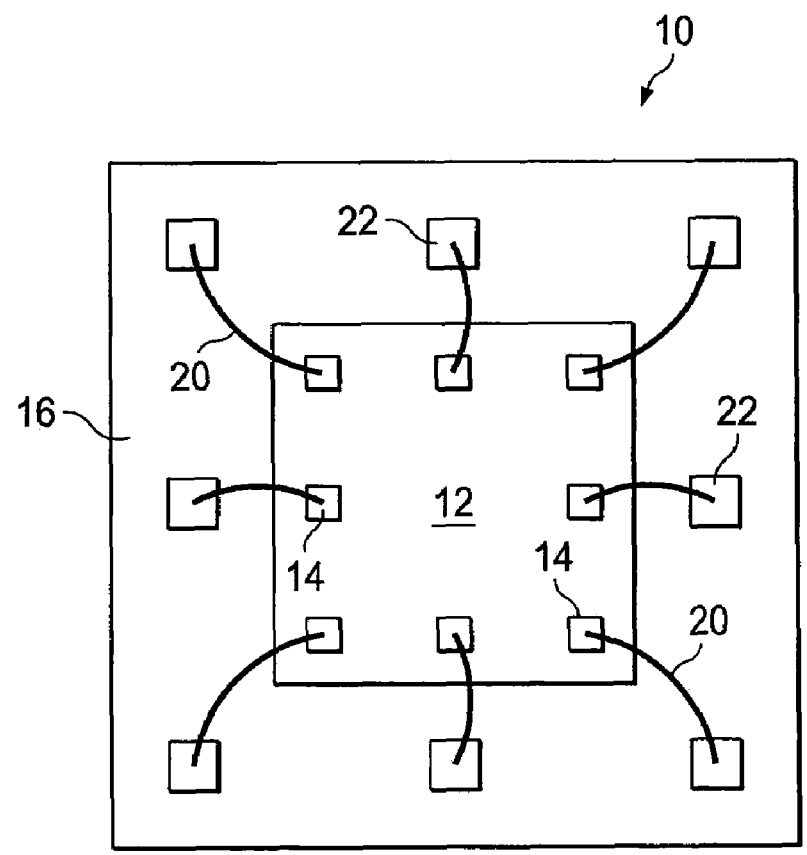
FIG. 1b illustrates a top view of a conventional semiconductor die mounted to a substrate, a plurality of wire bonds form electrical connections between contact pads of the semiconductor die and contact pads of the substrate.

FIG. 1a illustrates a cross-sectional view of conventional wire-bonded semiconductor package 10. FIG. 1b illustrates a top view of wire-bonded semiconductor package 10. Semiconductor die 12 having contact pads 14 is mounted over substrate 16 using adhesive material 18. Semiconductor die 12 includes an active area containing analog or digital circuits implemented as active devices, passive devices, conductive layers, and dielectric layers formed within semiconductor die 12 and are electrically interconnected according to the electrical design of the die. For example, the circuit may include one or more transistors, diodes, inductors, capacitors, resistors, and other circuit elements formed within the active area of die 12. Contact pads 14 are made with a conductive material such as aluminum (Al), copper (Cu), tin (Sn), nickel (Ni), gold (Au), or silver (Ag), and are electrically connected to the circuit elements formed within die 12. Contact pads 14 are formed by a physical vapor deposition (PVD), chemical vapor deposition (CVD), electrolytic plating, or electroless plating process. After mounting die 12 to substrate 16, bond wires 20 are formed between contact pads 14 of die 12 and contact pads 22 of substrate 16.

In packages such as that shown in FIG. 1a, wire bonds 20 are formed with a minimum bend radius. The minimum bend radius of the wire bond describes a minimum radius to which each wire bond can be bent before the bond is kinked, damaged, or otherwise loses its structural integrity. Because each wire bond has a minimum bend radius and because the height of the package should be minimized, contact pads of semiconductor dies tend to be formed around a perimeter of the die to minimize the length of the interconnecting wire bonds which simultaneously minimizes the overall height of the package. Accordingly, with reference to FIG. 1a, contact pads 14 of die 12 are formed around a perimeter of die 12, which results in shorter wire bonds 20.

Furthermore, as shown in FIG. 1b, it is important to distribute contact pads 14 around the perimeter of die 12 to ensure that wire bonds 20 do not contact one another. Because wire bonds 20 are not insulated and include a conductive material, if they were to contact one another they would short-circuit resulting in a malfunction of package 10. In many applications, an encapsulant, molding compound, or other insulative material is deposited over package 10 to provide mechanical protection and electrical isolation to the components of package 10. During the deposition of the encapsulant, however, the flow of the material may displace one or more of the wire bonds causing a short circuit. Accordingly, before deposition of the encapsulant, the wire bonds must be sufficiently separated to ensure their displacement will not result in a short circuit. Because the wire bonds in conventional wire-bonded packages must be separated by a minimum distance, the number of input/output connections for the package is minimized. Accordingly, it may be difficult to form the necessary electrical interconnection between the components formed within the semiconductor die of the package and external electrical components.

Figure 2A:
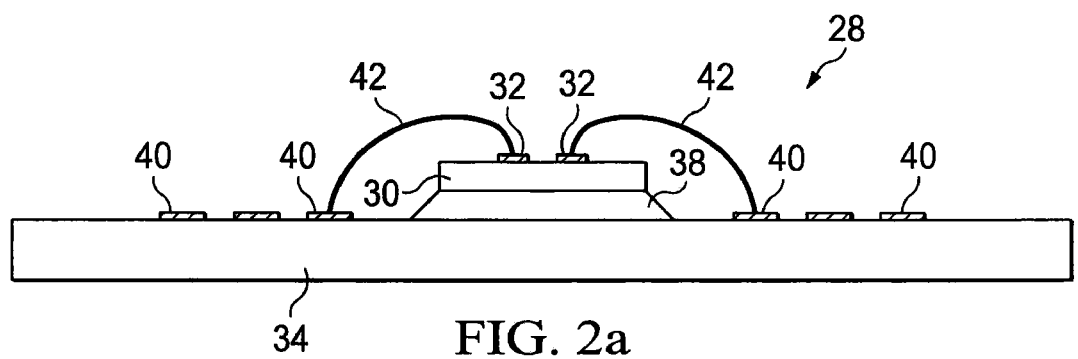
FIGS. 2a-2c illustrate a method of manufacturing a semiconductor package including a plurality of stacked dies having wire bond interconnects formed from a central region of the dies, the wire bonds include an electrically insulating and mechanically protective coating.
Figure 2B:
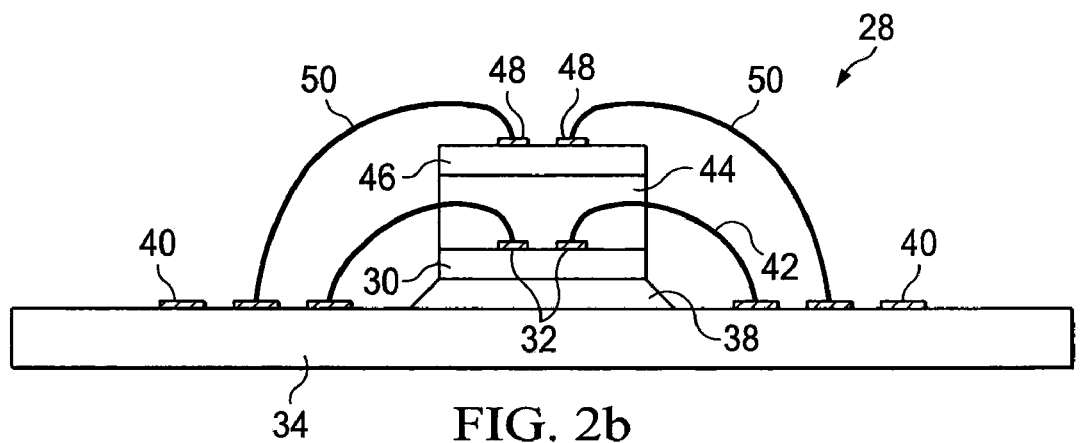
Figure 2C:
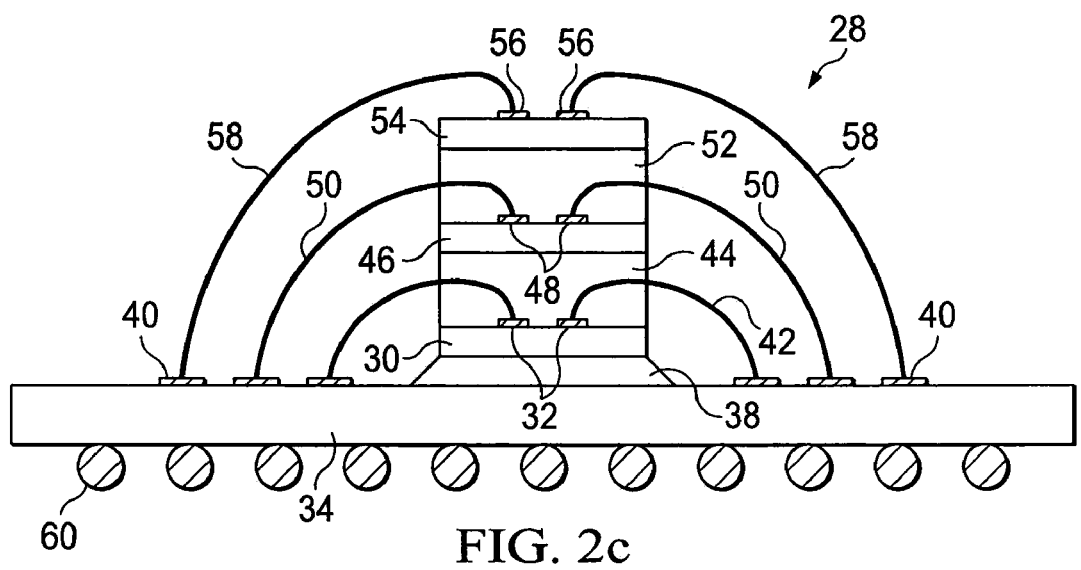

FIGS. 2a-2c illustrate a method of manufacturing semiconductor package 28 including a plurality of stacked dies having wire bond interconnects formed from a central region of the dies. Turning to FIG. 2a, die 30 having contact pads 32 is mounted to substrate 34 using die attach adhesive 38. Die 30 includes a semiconductor die and other electronic package or integrated circuit (IC) such as memory, controllers, application specific integrated circuits (ASICs), processors, microcontrollers, or combinations thereof. Contact pads 32 are formed over a central region of the top surface of die 30 using a PVD, CVD, electrolytic plating, or electroless plating process and include a conductive material. Substrate 34 includes an epoxy-based laminate, printed circuit board, Bismaleimide-Triazine (BT) or other substrate material suitable for the connection of electronic components. Substrate 34 may include an interconnect structure to electronically interconnect a plurality of contact pads formed over a surface of substrate 34 to one another and to contact pads formed over a back surface of substrate 34. A plurality of contact pads are formed over substrate 34. Contact pads 40 include a conductive material and are formed by a PVD, CVD, electrolytic plating, or electroless plating process over a first side of substrate 34. Die 30 is deposited over substrate 34. Underfill, die attach material, or adhesive 38 bonds die 30 to substrate 34.

Wire bonds 42 are formed between contact pads 32 of die 30 and contact pads 40 of substrate 34. Wire bonds 42 include a coated conductive material that can be electrically connected to contact pads 32 and 40 using conventional semiconductor wire bonding methods. In one embodiment, wire bonds 42 include a gold (Au) material, however other embodiments may include any other conductive material such as Ag, Al, or Cu, for example. The coating on wire bonds 42 provides both electrical insulation and mechanical protection to wire bonds 42. In one embodiment, wire bonds 42 include the X-WIRE™ INSULATED BONDING WIRE TECHNOLOGY product manufactured by Microbonds Inc. In one embodiment, the coating includes an organic coating applied using a microbond proprietary process. The coating also provides mechanical protection to the wire bonds which allows for the formation of wire bond interconnects having smaller bend radii. The smaller bend radii allow for each of the dies to be mounted closer together as the loop size of the wire bonds is minimized.

Figure 3A:
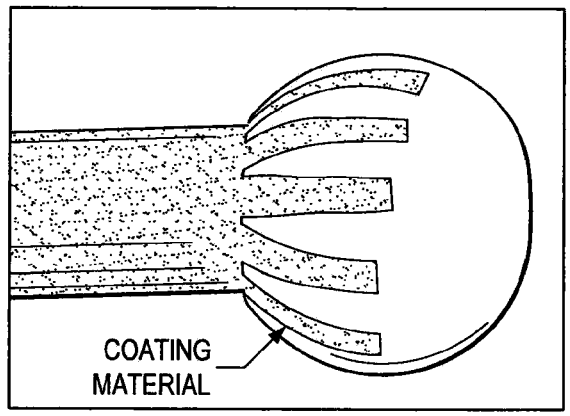
FIG. 3a illustrates a magnified view of an example wire bond structure, the wire bond structure includes a free-air ball or bumped end of the wire bond and a protective coating, the protective coating continues over portions of the bumped end.
Figure 3B:
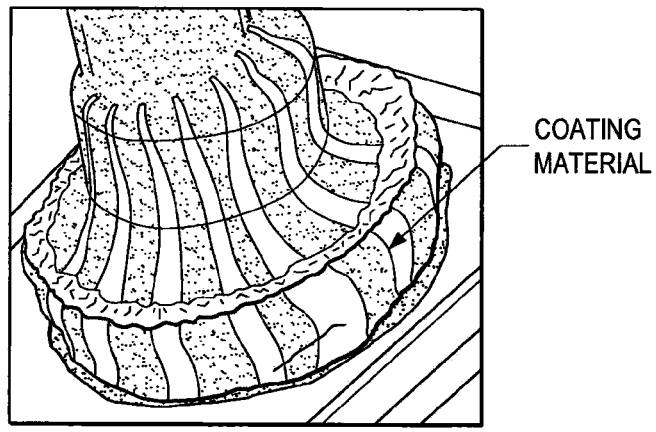
FIG. 3b illustrates a magnified view of an example wire bond structure mounted to a contact pad, the wire bond structure includes a free-air ball or bumped end of the wire bond and a protective coating, the protective coating continues over portions of the bumped end.

FIGS. 3a and 3b provide magnified illustrations of an example wire bond structure. FIG. 3a shows one end of the wire bond material before it is mounted to a contact pad. FIG. 3b illustrates the wire bond after being mounted to a contact pad. As shown in FIG. 3a, an electrically insulative and mechanically protective coating is formed over a shaft or length of the wire bond material. The coating is contiguous along the shaft and provides consistent protection to the wire bond. As the shaft transitions into the free-air ball or bumped end of the wire bond material, the coating splits and continues over portions of the bump. By splitting or separating portions of the coating, surfaces of the bumped ends of the wire bonds are exposed, allowing for the wire bond to be electrically connected to other system components or contact pads. The bumped end of the wire bond material may be formed by heating one end of the wire bond to mold the material and form the bump.

FIG. 3b illustrates the wire bond after being connected to a contact pad. The bumped ends of the wire bonds are brought into physical contact with the contact pad. After the wire bond contacts the contact pad, a combination of heat, mechanical force, and/or ultrasonic forces are applied to the bump. The bump deforms against the contact pad to form both an electrical and mechanical bond between the wire bond and the contact pad. As shown in FIG. 3b, even after the bonding process, the protective coating runs contiguously along the shaft of the wire bond and also protects some portions of the surface of the wire bond bump.

Turning to FIG. 2b, die 46 is mounted over die 30 using epoxy 44. Depending upon the application, epoxy 44 may include liquid dispensed epoxy, dry film epoxy, or other die attach materials. In alternative embodiments, however, epoxy 44 is replaced by an organic material such as benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be used in place of epoxy 44. Epoxy 44 is dispensed over die 30 and around wire bonds 42 using spin coating, needle dispensing, or another suitable application process. Die 46 is mounted to epoxy 44. Depending upon the package requirements, a mechanical force is applied to a top surface of die 46 to improve the mechanical bond between die 46 and epoxy 44. The mechanical force used to press die 46 against epoxy 44 may also be used to minimize the overall height of package 28. For example, by increasing the amount of force, the distance between die 30 and die 46 may be minimized, possibly by displacing a portion of epoxy 44 from the volume between die 30 and die 46. If sufficient force is applied, a bottom surface of die 46 may contact one of more of wire bonds 42. Because wire bonds 42 include an electrically insulative and mechanically protective coating, contact between the bottom surface of die 46 and wire bonds 42 is unlikely to cause damage to wire bonds 42 or result in a malfunction of package 28. Accordingly, by applying force to a top surface of die 46 during mounting, the overall height of package 28 is minimized.

Contact pads 48 are formed over a central region of the top surface of die 46 using a PVD, CVD, electrolytic plating, or electroless plating process and includes a conductive material. Wire bonds 50 are formed between contact pads 48 of die 46 and contact pads 40 of substrate 34. Wire bonds 50 include a coated conductive material that can be electrically connected to contact pads 48 and 40 using conventional semiconductor wire bonding methods. In one embodiment, wire bonds 50 include a Au material, however other embodiments may include any other conductive material such as Ag, Al, or Cu, for example. The coating on wire bonds 50 provides both electrical insulation and mechanical protection to wire bonds 50. In one embodiment, wire bonds 50 include the X-WIRE™ INSULATED BONDING WIRE TECHNOLOGY product manufactured by Microbonds Inc.

Turning to FIG. 2c, die 54 is mounted over die 46 using epoxy 52. Depending upon the application, epoxy 52 may include liquid dispensed epoxy, dry film epoxy, or other die attach materials. Epoxy 52 is dispensed over die 46 and around wire bonds 50 using spin coating, needle dispensing, or another suitable application process. Die 54 is mounted to epoxy 52. Depending upon the package requirements, a mechanical force is applied to a top surface of die 54 to improve the mechanical bond between die 54 and epoxy 52. The mechanical force used to press die 54 against epoxy 52 may also be used to minimize the overall height of package 28. For example, by increasing the amount of force, the distance between die 46 and die 54 may be minimized, possibly by displacing a portion of epoxy 52 from the volume between die 46 and die 54. If sufficient force is applied, a bottom surface of die 54 may contact one of more of wire bonds 58. Because wire bonds 58 include an electrically insulative and mechanically protective coating, contact between the bottom surface of die 54 and wire bonds 58 is unlikely to cause damage to wire bonds 58 or result in a malfunction of package 28. Accordingly, by applying force to a top surface of die 54 during mounting, the overall height of package 28 is minimized.

Contact pads 56 are formed over a central region of the top surface of die 54 using a PVD, CVD, electrolytic plating, or electroless plating process and includes a conductive material. Wire bonds 58 are formed between contact pads 56 of die 54 and contact pads 40 of substrate 34. Wire bonds 58 include a coated conductive material that can be electrically connected to contact pads 56 and 40 using conventional semiconductor wire bonding methods. In one embodiment, wire bonds 58 include a Au material, however other embodiments may include any other conductive material such as Ag, Al, or Cu, for example. The coating on wire bonds 58 provides both electrical insulation and mechanical protection to wire bonds 58. In one embodiment, wire bonds 58 include the X-WIRE™ INSULATED BONDING WIRE TECHNOLOGY product manufactured by Microbonds Inc.

A plurality of conductive bumps 60 are formed over a back surface of substrate 34 to allow package 28 to be electrically connected to other system components. Bumps 60 include a solder material deposited over substrate 34 and ref lowed to form bumps 60. In alternative embodiments, other interconnect structures such as stud bumps, microbumps, pillar bumps, wire bonds, conductive pillars or other metal connection structures using Cu, Au, or Ni, for example, are connected to semiconductor package 28 to allow for the connection of external system components.

Using the present method, a semiconductor package is fabricated that includes two or more stacked semiconductor die. The dies are stacked over one another and electrically connected to a substrate or other suitable die-attach medium. A plurality of center-row bond or contact pads are formed over each die. The center-row contact pads are electrically connected to contact pads formed over the substrate by a plurality of wire bonds. The wire bonds include an insulated wire bond material such as an insulated Au material including the X-WIRE™ INSULATED BONDING WIRE TECHNOLOGY product manufactured by Microbonds Inc. Because the wire bonds are mechanically and electrically isolated, they are protected should they contact one another or a surface of one of the stacked dies. Depending upon the application, the stack of dies may be compressed by application of a force during manufacture to minimize the height of the package. Again, the insulation layer of the wire bonds provide mechanical and electrical protection should one of the stacked dies contact a wire bond. Finally, because the wire bonds have a mechanically protective coating, they may be bent at a radius smaller than the normal bend radius for wire bonds. As a result, the loop formed by each of the wire bonds is minimized, and the stacked dies may be placed in closer proximity to one another. Accordingly, the package is fabricated with a minimized total package height and wirebonds connected to the center-row contact pads of each semiconductor die.

Figure 4:
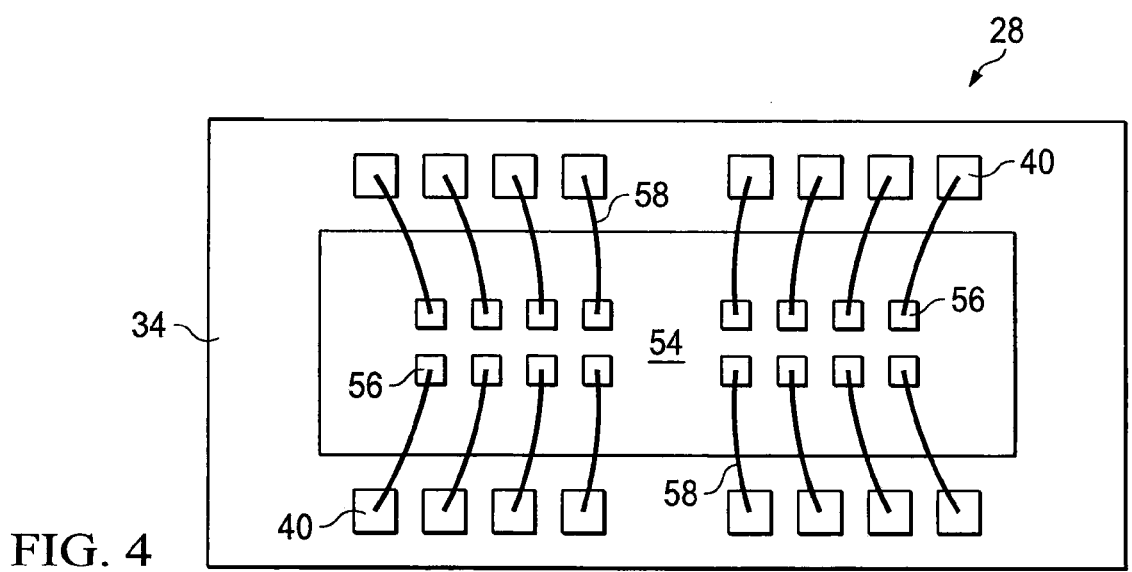
FIG. 4 illustrates a top view of a semiconductor package including a plurality of stacked die having wire bond interconnects formed from a central region of the dies, the wire bonds include an electrically insulating and mechanically protective coating.

FIG. 4 illustrates a top view of semiconductor package 28. Several die are stacked over substrate 34. As shown in FIG. 4, only the topmost die, die 54 is shown. Die 54 includes contact pads 56. Contact pads 56 are formed over a central region of the top surface of die 54 using a PVD, CVD, electrolytic plating, or electroless plating process and includes a conductive material. Wire bonds 58 are formed between contact pads 56 of die 54 and contact pads 40 of substrate 34. Wire bonds 58 include a coated conductive material that can be electrically connected to contact pads 56 and 40 using conventional semiconductor wire bonding methods. In one embodiment, wire bonds 58 include a Au material, however other embodiments may include any other conductive material such as Ag, Al, or Cu, for example. The coating on wire bonds 58 provides both electrical insulation and mechanical protection to wire bonds 58. In one embodiment, wire bonds 58 include the X-WIRE™ INSULATED BONDING WIRE TECHNOLOGY product manufactured by Microbonds Inc. The coating also provides mechanical protection to the wire bonds which allows for the formation of wire bond interconnects having smaller bend radii. The smaller bend radii allow for each of the dies to be mounted closer together as the loop size of the wire bonds is minimized.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor package, comprising:
   providing a substrate having a plurality of contact pads formed over a first surface of the substrate;
   mounting a first semiconductor die to the substrate, the first semiconductor die having center-row contact pads;
   forming first wire bonds between each of the center-row contact pads of the first semiconductor die and the plurality of contact pads formed over the first surface of the substrate, the first wire bonds including an electrically insulative coating formed over the shaft of the first wire bonds, and the electrically insulative coating covering a portion of a surface of a bumped end of the first wire bonds;
   depositing an epoxy material over the first semiconductor die and around a portion of the first wire bonds;
   mounting a second semiconductor die to the epoxy material, the second semiconductor die having center-row contact pads;
   forming second wire bonds between each of the center-row contact pads of the second semiconductor die and the plurality of contact pads formed over the first surface of the substrate, the second wire bonds including an electrically insulative coating formed over the shaft of the second wire bonds, and the electrically insulative coating covering a portion of a surface of a bumped end of the second wire bonds; and
   forming an interconnect structure on a second surface of the substrate opposite the first surface.

2. The method of claim 1, wherein the epoxy material includes liquid dispensed spacerless epoxy or dry film epoxy.

3. The method of claim 1, wherein the interconnect structure includes a plurality of solder bumps.

4. The method of claim 1, wherein the first and second wire bonds include an insulated gold (Au) material.

5. The method of claim 1, including applying a force to a top surface of the second semiconductor die to decrease a distance between the first and second semiconductor dies.

6. The method of claim 1, wherein the substrate includes an epoxy-based laminate, or Bismaleimide-Triazine (BT) laminate material.

7. The method of claim 1, wherein a bottom surface of the second semiconductor die contacts one of the first wire bonds.

8. A method of making a semiconductor package, comprising:
   providing a substrate having a plurality of contact pads formed over a first surface of the substrate;
   mounting a first semiconductor die to the substrate, the first semiconductor die having center-row contact pads;
   forming first wire bonds between each of the center-row contact pads of the first semiconductor die and the plurality of contact pads formed over the first surface of the substrate, the first wire bonds including an electrically insulative coating formed over the shaft of the first wire bonds, and the electrically insulative coating covering a portion of a surface of a bumped end of the first wire bonds;
   depositing an insulating material over the first semiconductor die and around a portion of the first wire bonds;
   mounting a second semiconductor die to the epoxy material, the second semiconductor die having contact pads; and
   forming second wire bonds between each of the contact pads of the second semiconductor die and the plurality of contact pads formed over the first surface of the substrate.

9. The method of claim 8, wherein the insulating material includes liquid dispensed spacerless epoxy or dry film epoxy.

10. The method of claim 8, including forming an interconnect structure over a second surface of the substrate.

11. The method of claim 8, wherein the first and second wire bonds include an insulated gold (Au) material.

12. The method of claim 8, including applying a force to a top surface of the second semiconductor die to decrease a distance between the first and second semiconductor dies.

13. The method of claim 8, wherein the substrate includes an epoxy-based laminate, or Bismaleimide-Triazine (BT) laminate material.

14. A method of making a semiconductor package, comprising:
   providing a substrate having a plurality of contact pads formed over a first surface of the substrate;
   mounting a first semiconductor die to the substrate, the first semiconductor die having center-row contact pads;
   forming first wire bonds between each of the center-row contact pads of the first semiconductor die and the plurality of contact pads formed over the first surface of the substrate, the first wire bonds including an electrically insulative coating formed over the shaft of the first wire bonds;
   depositing an insulating material over the first semiconductor die and around a portion of the first wire bonds; and
   mounting a second semiconductor die to the epoxy material, the second semiconductor die having contact pads.

15. The method of claim 14, including forming second wire bonds between each of the contact pads of the second semiconductor die and the plurality of contact pads formed over the first surface of the substrate.

16. The method of claim 14, wherein the insulating material includes liquid dispensed spacerless epoxy or dry film epoxy.

17. The method of claim 14, including applying a force to a top surface of the second semiconductor die to decrease a distance between the first and second semiconductor dies.

18. The method of claim 14, wherein the substrate includes an epoxy-based laminate, or Bismaleimide-Triazine (BT) laminate material.

19. The method of claim 14, including forming an interconnect structure over a second surface of the substrate.

* * * * *